(12) United States Patent
Nishiki et al.

(10) Patent No.: US 9,519,198 B2
(45) Date of Patent: Dec. 13, 2016

(54) LIQUID CRYSTAL DISPLAY DEVICE

(71) Applicant: Sharp Kabushiki Kaisha, Osaka (JP)

(72) Inventors: Hirohiko Nishiki, Osaka (JP); Takeshi Hara, Osaka (JP); Tohru Okabe, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/440,580

(22) PCT Filed: Nov. 20, 2013

(86) PCT No.: PCT/JP2013/081257
§ 371 (c)(1),
(2) Date: May 4, 2015

(87) PCT Pub. No.: WO2014/080930
PCT Pub. Date: May 30, 2014

(65) Prior Publication Data
US 2015/0286082 A1 Oct. 8, 2015

(30) Foreign Application Priority Data
Nov. 21, 2012 (JP) ................................. 2012-255173

(51) Int. Cl.
*G02F 1/1345* (2006.01)
*G02F 1/1368* (2006.01)
(Continued)

(52) U.S. Cl.
CPC ........... *G02F 1/1368* (2013.01); *G02F 1/1339* (2013.01); *G02F 1/13439* (2013.01);
(Continued)

(58) Field of Classification Search
CPC ........................... G02F 1/1368; G02F 1/13454
(Continued)

(56) References Cited

U.S. PATENT DOCUMENTS

| | | | |
|---|---|---|---|
| 2009/0323005 A1 | 12/2009 | Ota | |
| 2014/0022479 A1* | 1/2014 | Hosaka | G02F 1/1368 349/43 |
| 2014/0176886 A1* | 6/2014 | Yoshida | G02F 1/1339 349/110 |

FOREIGN PATENT DOCUMENTS

JP            2010-8758 A        1/2010

* cited by examiner

Primary Examiner — Lucy Chien
(74) Attorney, Agent, or Firm — Chen Yoshimura LLP

(57) ABSTRACT

A liquid crystal display device, which includes: a liquid crystal layer; and a first substrate and a second substrate that are arranged so as to face each other with the liquid crystal layer being sandwiched therebetween. On the liquid crystal layer side of the first substrate, there are provided: a plurality of first thin film transistors that are arranged in a display region; a peripheral drive circuit which includes a plurality of second thin film transistors and is arranged in the periphery of the display region so as to supply drive signals to the plurality of first thin film transistors; an organic insulating film that is formed so as to cover the plurality of first thin film transistors and the plurality of second thin film transistors; and an inorganic insulating film that is formed on the organic insulating film. Each of the plurality of second thin film transistors has a semiconductor layer that contains a source portion, a channel portion and a drain portion; and the inorganic insulating film is arranged in a region that does not overlap at least the channel regions of the plurality of second thin film transistors when viewed from a direction normal to the first substrate.

10 Claims, 3 Drawing Sheets

(51) Int. Cl.
 *G02F 1/1333* (2006.01)
 *H01L 27/12* (2006.01)
 *G02F 1/1339* (2006.01)
 *G02F 1/1362* (2006.01)
 *G02F 1/1343* (2006.01)
 *H01L 29/786* (2006.01)

(52) U.S. Cl.
 CPC .. *G02F 1/133345* (2013.01); *G02F 1/136277* (2013.01); *H01L 27/1248* (2013.01); *G02F 1/13454* (2013.01); *G02F 2001/134372* (2013.01); *H01L 29/78621* (2013.01); *H01L 29/78696* (2013.01)

(58) Field of Classification Search
 USPC .......................................................... 349/149
 See application file for complete search history.

LIQUID CRYSTAL DISPLAY DEVICE

TECHNICAL FIELD

The present invention relates to a liquid crystal display device.

This application claims the benefit of Japanese Patent Application No. 2012-255173, filed in Japan on Nov. 21, 2012, which is hereby incorporated by reference in its entirety.

BACKGROUND

Known types of liquid crystal display devices include vertical electric field display devices and lateral electric field display devices.

Vertical electric field display devices apply substantially vertical electric fields to liquid crystal molecules through a pair of electrodes with a liquid crystal layer therebetween. Different modes of vertical electric field liquid crystal display devices such as TN (twisted nematic) mode and VA (vertical alignment) mode exist.

The lateral electric field mode liquid crystal display device has a pair of electrodes insulated from each other provided on a liquid crystal layer side of one of a pair of substrates sandwiching the liquid crystal layer. The lateral electric field mode liquid crystal display device applies a substantially lateral electric field to the liquid crystal molecules. The modes of lateral electric field liquid crystal display devices include IPS (in-plane switching) mode and FFS (fringe field switching) mode.

Patent Document 1, for example, discloses a structure of an FFS mode display device in which a pixel electrode and a common electrode are disposed on the liquid crystal layer side of the array substrate such that the pixel electrode and the common electrode face each other across the interelectrode insulating film, which is formed of an inorganic insulating film.

A passivation film made of an inorganic insulating film is formed on the array substrate and covers the semiconductor layer. An interlayer film made of a resin material is formed so as to cover the passivation film. A pixel electrode is formed on the interlayer film. The interelectrode insulating film covers the pixel electrode on the interlayer film.

RELATED ART DOCUMENT

Patent Document

Patent Document 1: Japanese Patent Application Laid-Open Publication No. 2010-8758

SUMMARY OF THE INVENTION

Problems to be Solved by the Invention

Patent Document 1 discloses a method of forming the interelectrode insulating film in a lower temperature film formation condition than the passivation film so as to avoid the surfaces of the pixel electrode and the interlayer film from becoming rough. If the interelectrode insulating film is formed using a low temperature process, then the interelectrode insulating film becomes a film having a large amount of hydrogen. If this type of film having hydrogen is formed on the semiconductor layer, then there are cases in which the hydrogen in the film separates from the film and enters the semiconductor layer. If hydrogen enters the semiconductor layer, then the semiconductor layer will be affected by the hydrogen and the characteristics of the semiconductor layer will degrade.

The present invention was made to solve the above-mentioned problems and an aim thereof is to provide a liquid crystal display device that can suppress hydrogen from entering the semiconductor layer and suppress the degradation of the characteristics of the semiconductor layer.

Means for Solving the Problems

In order to achieve the above-mentioned object, the present invention adopts the following configurations.

(1) A liquid crystal display device according to a first aspect of the present invention includes: a liquid crystal layer; and a first substrate and a second substrate facing each other and sandwiching the liquid crystal layer, wherein the first substrate has, on a side facing the liquid crystal layer: a plurality of first thin-film transistors disposed in a display region of the first substrate; a peripheral driving circuit including a plurality of second thin-film transistors, the peripheral driving circuit being disposed in a periphery of the display region and supplying driving signals to the plurality of first thin-film transistors; an organic insulating film covering the plurality of first thin-film transistors and the plurality of second thin-film transistors; and an inorganic insulating film provided on the organic insulating film, wherein each of the plurality of second thin-film transistors has a semiconductor layer having a source portion, a channel portion, and a drain portion, and wherein the inorganic insulating film is formed in a region that does not overlap at least the channel portions of the plurality of second thin-film transistors when seen from a direction normal to the first substrate.

(2) The liquid crystal display device according to (1) may further include: a first transparent electrode and a second transparent electrode disposed in the display region, the first transparent electrode and second transparent electrode facing each other across the inorganic insulating film and forming a transparent capacitive structure (3) In the liquid crystal display device according to (1) or (2), the inorganic insulating film may be formed in a region that does not overlap the plurality of second thin-film transistors when seen from a direction normal to the first substrate.

(4) The liquid crystal display device according to any one of (1) to (3) may further include: a sealing member having a frame shape that bonds the first substrate to the second substrate with a prescribed gap therebetween, wherein the peripheral driving circuit is disposed within a region that is surrounded by the sealing member.

(5) In the liquid crystal display device according to (4), the organic insulating film may be disposed within the region that is surrounded by the sealing member, and the inorganic insulating film may cover a side of the organic insulating film facing the sealing member.

(6) The liquid crystal display device according to 4 or 5 may further include: a plurality of terminals formed outside the region surrounded by the sealing member, the plurality of terminals being electrically connected to the peripheral driving circuit, wherein an edge of the inorganic insulating film extends through the sealing member to a region having the plurality of terminals.

(7) In the liquid crystal display device according to any one of (1) to (6), a material forming the semiconductor layer may include an oxide composed of indium, gallium, and zinc.

Effects of the Invention

According to the present invention, it is possible to provide a liquid crystal display device that can suppress hydrogen from entering the semiconductor layer and suppress the characteristics of the semiconductor layer from degrading.

DETAILED DESCRIPTION OF EMBODIMENTS

Below, one embodiment of the present invention will be described with reference to FIGS. 1 to 4.

In order for the components in all of the respective drawings below to be easily understood, the components are sometimes shown with differing dimensional scales.

Figure 1:
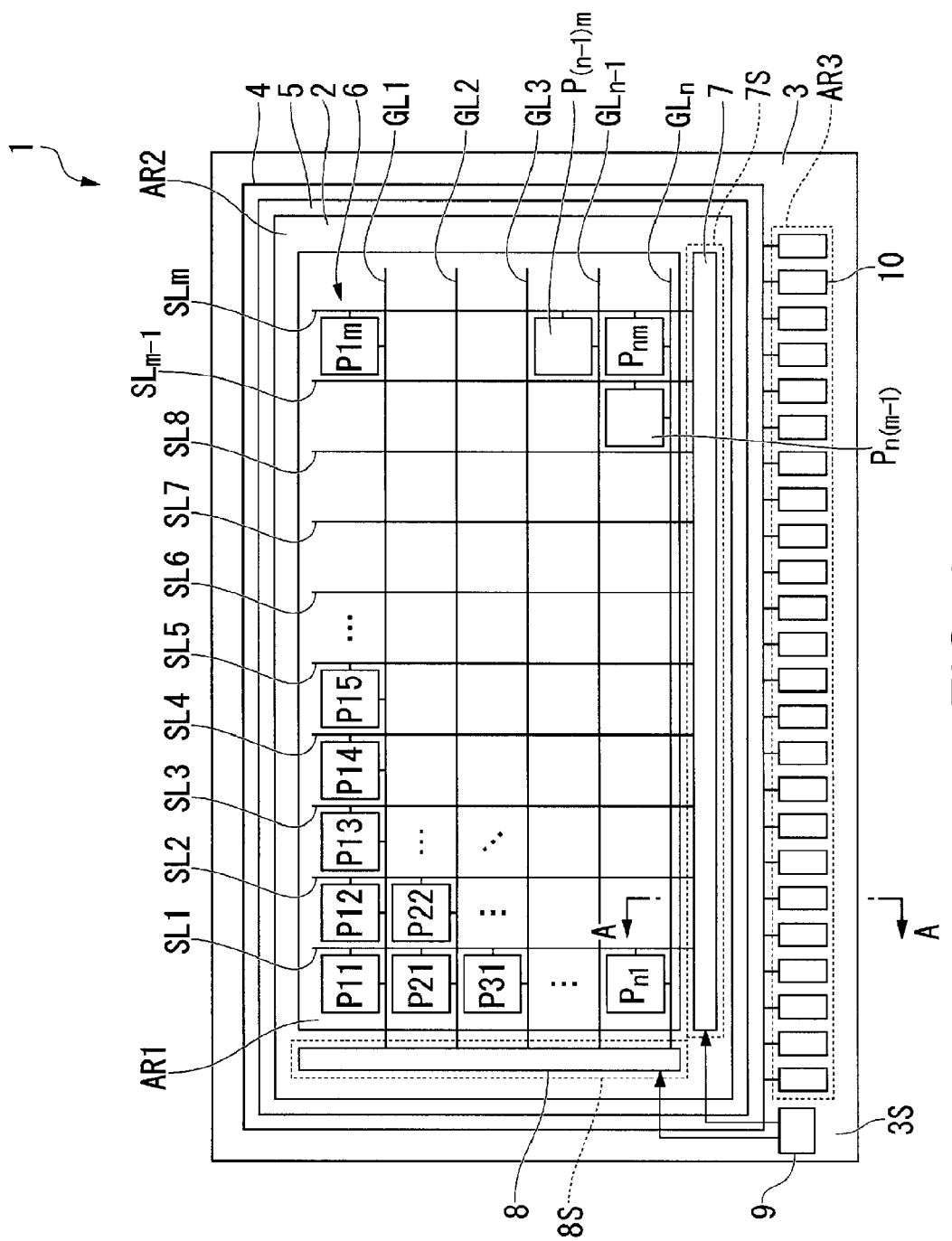
FIG. 1 is a plan view showing a liquid crystal display device of one embodiment of the present invention.

FIG. 1 is a plan view showing a liquid crystal display device 1 of one embodiment of the present invention.

As shown in FIG. 1, the liquid crystal display device 1 according to the present embodiment has a liquid crystal layer 2, an element substrate 3 (first substrate), an opposite substrate 4 (second substrate), and a sealing member 5.

The liquid crystal display device 1 of the present embodiment performs display through with the FFS (fringe field switching) mode, and liquid crystal having a positive birefringence are used in the liquid crystal layer 2.

Meanwhile, the display mode of the liquid crystal display device 1 is not limited to the FFS mode, and the TN (twisted nematic) mode, the VA (vertical alignment) mode, the STN (super twisted nematic) mode, the IPS (in-plane switching) mode, or the like can be used. In the present embodiment, an example of the liquid crystal display device 1 using the FFS mode will be explained.

As shown in FIG. 1, the element substrate 3 has a display region AR1 and a peripheral region AR2. The display region AR1 is a region in which a plurality of pixels (smallest unit of display region) are disposed in a matrix. The peripheral region AR2 is an area surrounding the display region AR1. The display region AR1 is in a rectangular shape when seen from a direction normal to (hereinafter, plan view) the element substrate 3. The peripheral region AR2 has a rectangular frame shape in a plan view.

In the display region AR1 of the element substrate 3, a plurality of source bus lines (SL1 to SLm), a plurality of gate bus lines (GL1 to GLn), and a plurality of first thin film transistors 6 (hereinafter, abbreviated as first TFTs) are provided. In the descriptions below, the term source bus lines SL is occasionally used to collectively refer to the source bus lines. The term gate bus lines GL is occasionally used to collectively refer to the gate bus lines.

The respective plurality of source bus lines SL are disposed adjacent to each other so as to extend parallel to each other. The respective plurality of gate bus lines GL extend parallel to each other, and are disposed so as to be adjacent to each other and perpendicular to the plurality of source bus lines SL. The plurality of source bus lines SL and the plurality of gate bus lines GL do not need to be perpendicular to each other and may be intersecting each other at an angle other than 90°.

In the display region AR1 of the element substrate 3, the plurality of source bus lines SL and the plurality of gate bus lines GL are formed in a grid pattern. The rectangular region defined by the adjacent source bus lines SL and the adjacent gate bus lines GL is one pixel. In the present embodiment, a plurality of pixels (P11 to Pnm) are disposed in a matrix. In the descriptions below, pixels are collectively referred to as pixels P in some cases.

A plurality of first TFTs 6 are provided in accordance with the respective intersections of the plurality of source bus lines SL and the plurality of gate bus lines GL.

A source driver 7 and a gate driver 8 are provided in the peripheral region AR2 of the element substrate 3 as peripheral driving circuits. The source driver 7 and the gate driver 8 are disposed within a region surrounded by the sealing member 5. The liquid crystal display device 1 of the present embodiment has a structure including an internal peripheral driving circuit. The source driver 7 and the gate driver 8 include a plurality of second thin-film transistors (hereinafter, abbreviated as second TFT), which will be described later.

The source driver 7 extends along the alignment direction (hereinafter, also referred to as horizontal line direction) of the plurality of source bus lines SL. The source driver 7 is electrically connected to the plurality of source bus lines SL.

The gate driver 8 extends in a direction parallel to the extending direction (hereinafter, also referred to as the vertical line direction) of the source bus lines SL. The gate driver 8 is electrically connected to the plurality of gate bus lines GL.

The sealing member 5 is disposed along the peripheral portion of the opposite substrate 4 and has a rectangular frame shape in a plan view. The control circuit 9 and the plurality of terminals 10 are provided in the area of the element substrate 3 that is not surrounded by the sealing member 5.

The plan view size of the element substrate 3 is greater than the plan view size of the opposite substrate 4. The element substrate 3 has a region 3S protruding from the opposite substrate 4 (hereinafter, also referred to as protruding region). The control circuit 9 and the plurality of terminals 10 are disposed on the protruding region 3S of the element substrate 3.

The control circuit 9 supplies a signal to the source driver 7 and the gate driver 8 to perform display in the liquid crystal display device 1. Specifically, the control circuit 9 supplies an image signal to the source driver 7. The control circuit 9 supplies a control signal to the source driver 7 and the gate driver 8. The source driver 7 and the gate driver 8 supply a driving signal to the plurality of first TFTs 6.

The control signal supplied to the gate driver 8 includes a gate start pulse (GSP), a gate shift clock signal (GSC), and a gate output enable signal (GOE).

The control signal supplied to the source driver 7 includes a source start pulse (SSP), source shift clock signal (SSC), source output enable signal (SOE), polar control signal (POL), and the like.

Gate driver 8 serially supplies scan signals to the gate bus lines (GL1 to GLn) in the order of GL1, GL2, GL3, ... GLn. In response to this scan signal, the first TFT 6 will be driven in units of horizontal lines.

The source driver 7 converts the received image signals into analog image signals. The source driver 7 supplies an image signal for one horizontal line to the plurality of source bus lines (SL1 to SLm) for each horizontal period in which a scan signal is supplied to the gate bus lines GL.

The plurality of terminals 10 are arranged along a horizontal line direction. The plurality of terminals 10 are electrically connected to the source driver 7 and the gate driver 8 as peripheral driving circuits. In the descriptions below, the region AR3 having the plurality of terminals 10 of the element substrate 3 is referred to as the terminal forming region.

Figure 2:
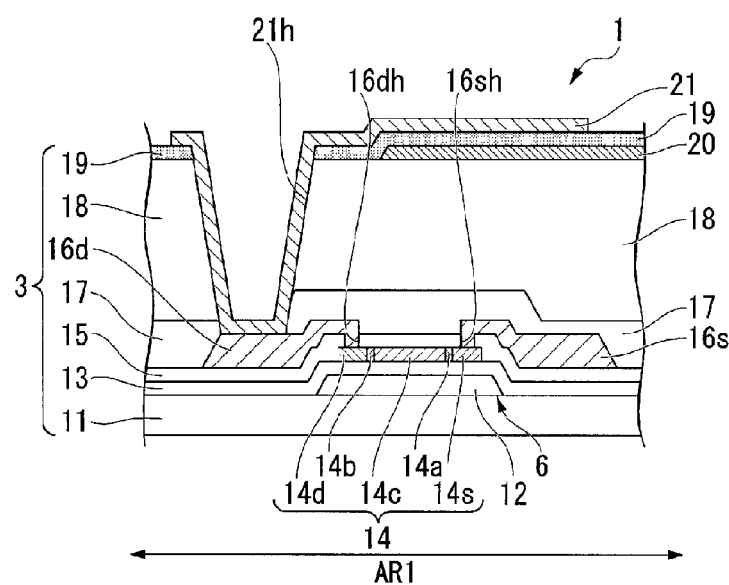
FIG. 2 is a cross-sectional view of a display region of an element substrate in a liquid crystal display device.
Figure 3:
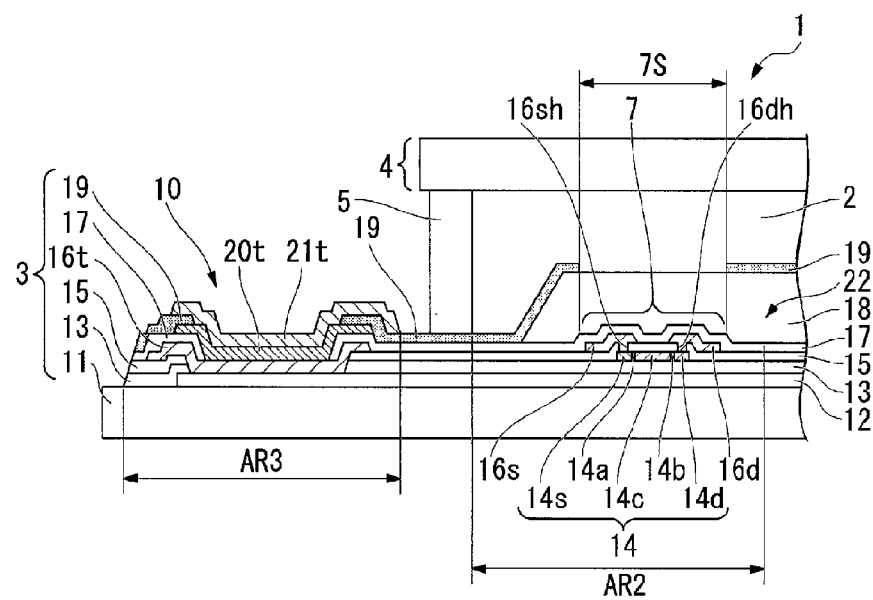
FIG. 3 is a cross-sectional view of a peripheral region and a terminal forming region of the liquid crystal display device along a line A-A in FIG. 1.

FIG. 2 is a cross-sectional view of the display region AR1 of the element substrate 3 of the liquid crystal display device 1. FIG. 3 is a cross-sectional view of the peripheral region AR2 of the liquid crystal display device 1 and the terminal forming region AR3 along the line A-A of FIG. 1. For convenience of explanation, the alignment film is omitted in FIGS. 2 and 3.

As shown in FIG. 3, the element substrate 3 and the opposite substrate 4 face each other across the liquid crystal layer 2. A sealing member 5 bonds the element substrate 3 and the opposite substrate 4 to each other with a prescribed gap therebetween.

First, the structure of the display region AR1 of the element substrate 3 will be described using FIG. 2.

As shown in FIG. 2, in the display region AR1 of the element substrate 3, the first TFT 6 is formed on the transparent substrate 11 that forms a portion of the element substrate 3. In FIG. 2, for convenience of explanation, only one of the plurality of first TFTs 6 disposed in the display region AR1 is shown. A glass substrate can be used for the transparent substrate 11, for example.

The first TFT 6 has a gate electrode 12 formed of a first conductive film, a gate insulating film 13, a semiconductor layer 14, and source and drain electrodes 16s and 16d formed of a second conductive film.

The first TFT 6 of the present embodiment is an n-channel transistor. However, the first TFT 6 is not limited to an n-channel transistor and may be a p-channel transistor.

The first TFT 6 of the present embodiment is a bottom gate transistor. However, the first TFT 6 is not limited to the bottom gate type and may be a top gate type.

The gate electrode 12 is formed on the transparent substrate 11. The gate electrode 12 can be formed of a material such as a multi-layer film of W (tungsten)/TaN (nitride tantalum), or Mo (molybdenum), Ti (titanium), Al (aluminum), or the like, for example. The gate electrode 12 is constituted by a portion of the gate bus lines GL.

The gate insulating film 13 is formed on the transparent substrate 11 so as to cover the gate electrode 12. The gate insulating film 13 can be formed of an inorganic insulating material such as a silicon nitride film, a silicon oxide film, a silicon oxynitride film, or a multi-layer film of these, for example.

On the gate insulating film 13, the semiconductor layer 14 is formed in a position opposing the gate electrode 12. The semiconductor layer 14 can be made of IGZO (In—Ga—Zn—O semiconductor), an oxide composed of indium, gallium, and zinc.

The material of the semiconductor layer 14 is not limited to oxide semiconductors such as IGZO, and other silicon semiconductors such as CGS (continuous grain silicon), LPS (low-temperature poly-silicon), or a-Si (amorphous silicon) can be used.

However, for the reasons described below, it is preferable that the material of the semiconductor layer 14 be an oxide semiconductor such as IGZO.

Oxide semiconductors have higher mobility than a-Si. As a result, a TFT using an oxide semiconductor can operate at a higher speed than a TFT using a-Si. Furthermore, the process of forming the oxide semiconductor layer is simpler than that of the polycrystalline silicon layer, and thus, the oxide semiconductor layer can be used for devices requiring a large area.

An oxide semiconductor layer can be formed using the following procedure, for example. First, an IGZO film with a thickness of 30 nm to 300 nm is formed on the insulating film using the sputtering method. Next, a resist mask that covers prescribed regions of the IGZO film is formed by photolithography. Then, the portions of the IGZO film not covered by the resist mask are removed by wet etching. After this, the resist mask is removed. This is how an oxide semiconductor layer is obtained.

In addition, other oxides such as IZO (In—Zn—O semiconductor) formed of indium and zinc, and ZTO (Zn—Ti—O) formed of zinc and titanium can be used as an oxide semiconductor instead of IGZO.

The semiconductor layer 14 includes a channel region 14c, a first high-concentration impurity region 14s, a second high-concentration impurity region 14d, a first low-concentration impurity region 14a, and a second low-concentration impurity region 14b.

The channel region 14c functions as a channel portion of the semiconductor layer 14. The first high-concentration impurity region 14s functions as a source portion of the semiconductor layer 14. The second high-concentration impurity region 14d functions as a drain portion of the semiconductor layer 14.

The first high-concentration impurity region 14s and the second high-concentration impurity region 14d are provided with a gap therebetween so as to be on either side of the channel region 14c. The first high-concentration impurity region 14s is provided closer to the source electrode 16s than the channel region 14c. The second high-concentration impurity region 14d is provided closer to the drain electrode 16d than the channel region 14c.

The channel region 14c is doped with a p-type impurity such as B (boron).

The first high-concentration impurity region 14s and the second high-concentration impurity region 14d each include a high concentration of n-type impurities compared to a low-concentration impurity region. As a result, the first high-concentration impurity region 14s and the second high-concentration impurity region 14d have a higher n-type carrier concentration than the low-concentration impurity regions.

The first low-concentration impurity region 14a is provided between the channel region 14c and the first high-concentration impurity region 14s. The second low-concentration impurity region 14b is provided between the channel region 14c and the second high-concentration impurity region 14d.

The first low-concentration impurity region 14a and the second low-concentration impurity region 14b each include lower concentrations of n-type impurities than the high-concentration impurity regions. As a result, the first low-concentration impurity region 14a and the second low-concentration impurity region 14b have lower n-type carrier concentrations than the high-concentration impurity regions.

In this manner, the first high-concentration impurity region 14s, the first low-concentration impurity region 14a, the second high-concentration impurity region 14d, and the second low-concentration impurity region 14b each have an LDD (lightly doped drain) structure.

The first interlayer insulating film 15 is formed on the gate insulating film 13 so as to cover the semiconductor layer 14. As a material of the first interlayer insulating film 15, an inorganic insulating material similar to that of the gate insulating film 13 can be used.

The source electrode 16s and the drain electrode 16d are formed on the first interlayer insulating film 15. The source electrode 16s is connected to the first high-concentration impurity region 14s of the semiconductor layer 14 through a contact hole 16sh that penetrates the first interlayer insulating film 15. The drain electrode 16d is connected to the second high-concentration impurity region 14d of the semiconductor layer 14 through a contact hole 16dh that penetrates the first interlayer insulating film 15. The material forming the source electrode 16s and the drain electrode 16d can be a conductive material similar to that of the gate electrode 12.

On the first interlayer insulating film 15, the first passivation film 17 is formed so as to cover the source electrode 16s and the drain electrode 16d. An inorganic insulating material similar to that of the gate insulating film 13 can be used as a material of the first passivation film 17.

The second interlayer insulating film 18 (organic insulating film) is formed on the first passivation film 17. An organic insulating material such as polyimide, polyamide, acryl, polyimideamide, or benzocyclobutene can be used as a material forming the second interlayer insulating film 18.

The common electrode 20 (first transparent electrode) made of the third conductive film is formed on the second interlayer insulating film 18. A transparent conductive material such as ITO (indium tin oxide) or IZO (indium zinc oxide) can be used as a material of the common electrode 20.

The second passivation film 19 (inorganic insulating film) is formed on the second interlayer insulating film 18 so as to cover the common electrode 20. An inorganic insulating material similar to that of the first passivation film 17 can be used as a material of the second passivation film 19.

The pixel electrode 21 (second transparent electrode) made of a fourth conductive film is formed on the second passivation film 19. A transparent conductive material similar to that of the common electrode 20 can be used as the material of the pixel electrode 21.

In the display region AR1, a transparent capacitive structure is formed by the common electrode 20 and the pixel electrode 21 disposed so as to face each other across the second passivation film 19. In the display region AR1, the second passivation film 19 functions as an interelectrode insulating film between the common electrode 20 and the pixel electrode 21.

The pixel electrode 21 is connected to the drain electrode 16d through the contact hole 21h that penetrates the first passivation film 17, the second interlayer insulating film 18, and the second passivation film 19. The pixel electrode 21 is connected to the second high-concentration impurity region 14d of the semiconductor layer 14 through the drain electrode 16d that functions as a relay electrode.

Due to this type of configuration, after a scan signal is supplied through the gate bus line GL and the first TFT 6 is in an ON state, then the image signal supplied to the source electrode 16s through the source bus line SL is supplied to the pixel electrode 21 through the semiconductor layer 14 and the drain electrode 16d.

An alignment film (not shown) is formed on the second passivation film 19 so as to cover the pixel electrode 21. The alignment film has an orientation controlling force that horizontally orients the liquid crystal molecules forming the liquid crystal layer.

Next, the structure of the peripheral region AR2 of the element substrate 3 will be described through FIG. 3. In FIG. 3, the same reference character is used for the same constituting elements in FIG. 2, and detailed descriptions thereof are omitted.

As shown in FIG. 3, in the peripheral region AR2 of the element substrate 3, the second TFT 22 forming the source driver 7 is provided on the transparent substrate 11 forming the element substrate 3. In FIG. 3, for convenience of explanation, only one of the plurality of second TFTs 22 that are disposed in the peripheral region AR2 is shown.

The second interlayer insulating film 18 is formed so as to cover the plurality of first TFTs 6 and the plurality of second TFTs 22. The second interlayer insulating film 18 is disposed in an area surrounded by the sealing member 5. The second passivation film 19 is formed on the second interlayer insulating film 18.

The second passivation film 19 is formed so as to cover a side face of the second interlayer insulating film 18 facing the sealing member 5. In the peripheral region AR2, the second passivation film 19 functions as a gas barrier film for suppressing moisture and the like from entering the second interlayer insulating film 18.

As shown in FIG. 3, the second passivation film 19 is not disposed directly above the source driver 7. Specifically, as shown in FIG. 1, the second passivation film 19 is disposed in an area that does not overlap the source driver 7 (area excluding the forming region 7S of the source driver 7) in a plan view. The second passivation film 19 is disposed in an area that does not overlap the gate driver 8 (area other than the forming area 8S of the gate driver 8) in a plan view. In the second passivation film 19, an opening is formed in an area that overlaps the forming region 7S of the source driver 7 and the forming region 8S of the gate driver 8 in a plan view.

The opening can be formed using the following procedure, for example. First, using the CVD method, an inorganic insulating film such as a silicon nitride film is formed on the second interlayer insulating film 18. Next, a portion of the inorganic insulating film overlapping the source driver 7 and the gate driver 8 in a plan view is removed by dry etching. In this manner, the second passivation film 19 is obtained.

The opening can also be formed in the manner described below. First, by performing photolithography, a resist mask that covers an area overlapping the source driver 7 and the gate driver 8 in a plan view is formed. Next, using the CVD method, an inorganic insulating film is formed on the second interlayer insulating film 18 so as to cover the resist mask. After this, the resist mask is removed. In this manner, the second passivation film 19 is obtained.

Next, the structure of the terminal forming region AR3 of the element substrate 3 will be described using FIG. 3.

In the terminal forming region AR3 of the element substrate 3, the terminal 10 is formed on the transparent substrate 11, which forms a portion of the element substrate 3.

The terminal 10 is formed on the transparent substrate 11 by stacking the first conductive film formed in the same layer as the gate electrode 12, the second conductive film 16t, the third conductive film 20t, and the fourth conductive film 21t in that order from the transparent substrate 11 side. A conductive material similar to that of the source electrode 16s and the drain electrode 16d can be used as the material of the second conductive film 16t. A conductive material similar to that of the common electrode 20 can be used as the material of the third conductive film 20t. A conductive material similar to that of the pixel electrode 21 can be used as the material of the fourth conductive film 21t.

The edge of the second passivation film 19 extends toward the terminal forming region AR3 through the sealing member 5. The edge of the second passivation film 19 is disposed between the edge of the third conductive film 20t and the edge of the fourth conductive film 21t.

Next, a configuration of the opposite substrate 4 will be explained.

The base of the opposite substrate 4 is a transparent substrate such as a glass substrate. The opposite substrate 4 is a color filter substrate having a color filter layer and a black matrix layer formed on the transparent substrate. An alignment film (not shown) is formed on a side of the opposite substrate 4 facing the liquid crystal layer 2.

Next, the effects of the liquid crystal display device 1 of the present embodiment will be described with reference to FIGS. 3 and 4.

Figure 4:
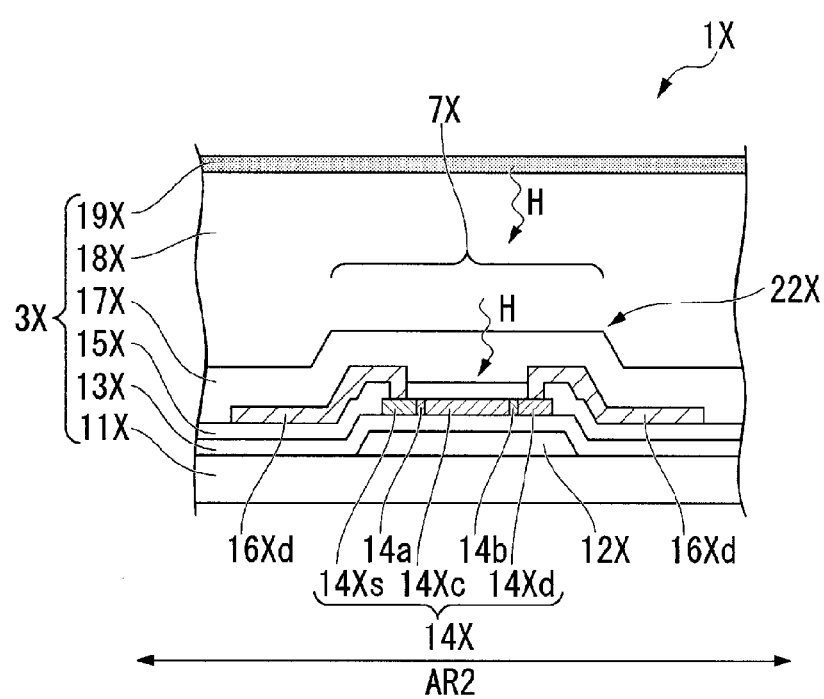
FIG. 4 is a cross-sectional view of a peripheral region of a liquid crystal display device according to a comparison example.

FIG. 4 is a cross-sectional view of a peripheral region AR2 related to the liquid crystal display device 1X of a comparison example. In FIG. 4, for convenience of explanation, the liquid crystal layer, the opposite substrate, and the alignment film are omitted.

The reference character 3X refers to the element substrate in FIG. 4. The reference character 7X refers to the source driver. The reference character 11X refers to the transparent substrate. The reference character 12X refers to the gate electrode. The reference character 13X refers to the gate insulating film. The reference character 14X refers to the semiconductor layer. The reference character 14Xc refers to the channel region (equivalent to the channel portion). The reference character 14Xs refers to the first high-concentration impurity region (equivalent to the source portion). The reference character 14Xd refers to the second high-concentration impurity region (equivalent to the drain portion). The reference character 14Xa refers to the first low-concentration impurity region. The reference character 14Xb refers to the second low-concentration impurity region. The reference character 15X is the first interlayer insulating film. The reference character 16Xs refers to the source electrode. The reference character 16Xd refers to the drain electrode. The reference character 17X is the first passivation film. The reference character 18X refers to the second interlayer insulating film (equivalent to the organic insulating film). The reference character 19X refers to the second passivation film (equivalent to the inorganic insulating film). The reference character 22X refers to the second TFT.

As shown in FIG. 4, the second passivation film 19X is disposed directly above the source driver 7X in the liquid crystal display device 1X of the comparison example.

In the peripheral region AR2, if the second passivation film 19X is configured to be disposed on the second interlayer insulating film 18X that is an organic insulating film, then the second passivation film 19X cannot be formed at a high temperature. If the second passivation film 19X is formed using a low temperature process, then the second passivation film 19X becomes a film having a lot of hydrogen (H). If this type of film having hydrogen is formed on the semiconductor layer 14X, then there are cases in which the hydrogen in the film separates from the film and enters the semiconductor layer 14X. If hydrogen enters the semiconductor layer 14X, then the semiconductor layer 14X is affected by the hydrogen and the characteristics of the semiconductor layer 14X degrade.

In addition, in the present embodiment, the second passivation film 19 is formed on the second interlayer insulating film 18, which is an organic insulating film, and therefore the second passivation film 19 cannot be formed at a high temperature. However, as shown in FIG. 3, in the present embodiment, the second passivation film 19 is not disposed directly above the source driver 7. As a result, even if the second passivation film 19 is formed using a low-temperature process, and the second passivation film 19 becomes a film having a lot of hydrogen, hydrogen that separates from the film having hydrogen is suppressed from entering the semiconductor layer 14. Thus, it is possible to suppress hydrogen from entering the semiconductor layer 14 and thereby suppress the characteristics of the semiconductor layer 14 from degrading.

In order to suppress the degradation of the characteristics of the semiconductor layer 14, it is important to suppress hydrogen separated from the film that has hydrogen from entering the channel region 14c of the semiconductor layer 14. In the present embodiment, the second passivation film 19 is disposed in an area that does not overlap the source driver 7 and the gate driver 8 in a plan view. As a result, the second passivation film 19 and the channel region 14c are separated in a plan view. Thus, hydrogen separated from the film having hydrogen is less likely to enter the channel region 14c of the semiconductor layer 14. As a result, it is easier to suppress the degradation of the characteristics of the semiconductor layer 14. Furthermore, it is easier to form an opening in an area of the second passivation film 19 overlapping the source driver 7 and the gate driver 8 in a plan view.

Descriptions of the present embodiment described the second passivation film 19 as being disposed in an area that does not overlap the source driver 7 and the gate driver 8 in a plan view, but the present invention is not limited to this example.

The second passivation film 19 may be formed in an area that does not overlap the plurality of second TFTs 22 in a plan view, for example. In this case, an opening is formed in an area of the second passivation film 19 overlapping the plurality of second TFTs 22 in a plan view. The second passivation film 19 may be formed in an area that does not overlap the channel region 14c of the plurality of second TFTs 22 in a plan view. In this case, an opening is formed in an area of the second passivation film 19 overlapping the channel region 14c of the plurality of second TFTs 22 in a plan view. In other words, it is only necessary that the second passivation film 19 be formed in an area that does not overlap the channel region 14c of the plurality of second TFTs 22 in a plan view.

However, from the perspective of making it easier to suppress the degradation of the characteristics of the semiconductor layer 14, or to make it easier to form an opening in the second passivation film 19, it is preferable that the second passivation film 19 be disposed in an area that does not overlap the source driver 7 and the gate driver 8 in a plan view.

In addition, the second passivation film 19 is formed as a gas barrier film covering a side face of the second interlayer insulating film 18 facing the sealing member 5. As a result, in the peripheral region AR2, moisture and the like can be suppressed from entering the second interlayer insulating film 18.

Suitable embodiments of the present invention have been described with reference to drawings, but the present invention is not limited to these. The forms and combinations of the respective parts described in the embodiments above are examples, and can be changed based on the requirement of design and the like without departing from the scope.

In addition, the form, number, positions, material, method of forming, and the like of the respective constituting elements of the liquid crystal display device are not limited to the respective embodiments above and can be changed as appropriate.

INDUSTRIAL APPLICABILITY

The present invention can be used for liquid crystal display devices.

DESCRIPTION OF REFERENCE CHARACTERS 1 liquid crystal display device
2 liquid crystal layer
3 element substrate (first substrate)
4 opposite substrate (second substrate)
5 sealing member
6 first TFT (first thin-film transistor)
7 source driver (peripheral driving circuit)
8 gate driver (peripheral driving circuit)
10 terminal
14 semiconductor layer
14s first high-concentration impurity region (source portion)
14c channel region (channel portion)
14d second high-concentration impurity region (drain portion)
18 second interlayer insulating film (organic insulating film)
19 second passivation film (inorganic insulating film)
20 common electrode (first electrode)
21 pixel electrode (second electrode)
22 second TFT (second thin-film transistor)
AR1 display region
AR2 peripheral region
AR3 terminal forming region (region having a plurality of terminals)

What is claimed is:

1. A liquid crystal display device, comprising:
a liquid crystal layer; and
a first substrate and a second substrate facing each other and sandwiching the liquid crystal layer; and
a sealing member having a frame shape that bonds the first substrate to the second substrate with a prescribed gap therebetween,
wherein the first substrate has, on a side facing the liquid crystal layer:
a plurality of first thin-film transistors disposed in a display region of the first substrate;
a peripheral driving circuit including a plurality of second thin-film transistors, said peripheral driving circuit being disposed in a periphery of the display region and supplying driving signals to the plurality of first thin-film transistors;
an organic insulating film covering the plurality of first thin-film transistors and the plurality of second thin-film transistors; and
an inorganic insulating film provided on the organic insulating film in the display region and the periphery of the display region,
wherein each of the plurality of second thin-film transistors has a semiconductor layer having a source portion, a channel portion, and a drain portion,
wherein the inorganic insulating film is formed in a region that does not overlap at least the channel portions of the plurality of second thin-film transistors when seen from a direction normal to the first substrate, and
wherein said sealing member does not overlap the organic insulating film.

2. The liquid crystal display device according to claim 1, further comprising:
a first transparent electrode and a second transparent electrode disposed in the display region, said first transparent electrode and second transparent electrode facing each other across the inorganic insulating film and forming a transparent capacitive structure.

3. The liquid crystal display device according to claim 1, wherein the inorganic insulating film is formed in a region that does not overlap the plurality of second thin-film transistors when seen from a direction normal to the first substrate.

4. The liquid crystal display device according to claim 1, further comprising:
wherein the peripheral driving circuit is disposed within a region that is surrounded by the sealing member.

5. The liquid crystal display device according to claim 4, wherein the organic insulating film is disposed within the region that is surrounded by the sealing member, and
wherein the inorganic insulating film covers a side of the organic insulating film facing the sealing member.

6. The liquid crystal display device according to claim 4, further comprising:
a plurality of terminals formed outside the region surrounded by the sealing member, said plurality of terminals being electrically connected to the peripheral driving circuit,
wherein an edge of the inorganic insulating film extends through the sealing member to a region having the plurality of terminals.

7. The liquid crystal display device according to claim 1, wherein a material forming the semiconductor layer includes an oxide composed of indium, gallium, and zinc.

8. The liquid crystal display device according to claim 1, wherein the sealing member overlaps the inorganic insulating film.

9. The liquid crystal display device according to claim 8, wherein the inorganic insulating film extends outside of a region surrounded by the sealing member and beyond the sealing member.

10. A liquid crystal display device, comprising:
a liquid crystal layer; and
a first substrate and a second substrate facing each other and sandwiching the liquid crystal layer; and
a sealing member having a frame shape that bonds the first substrate to the second substrate with a prescribed gap therebetween,
wherein the first substrate has, on a side facing the liquid crystal layer:
a plurality of first thin-film transistors disposed in a display region of the first substrate;
a peripheral driving circuit including a plurality of second thin-film transistors, said peripheral driving circuit being disposed in a periphery of the display region and supplying driving signals to the plurality of first thin-film transistors;
an organic insulating film covering the plurality of first thin-film transistors and the plurality of second thin-film transistors; and
an inorganic insulating film provided on the organic insulating film, wherein each of the plurality of second thin-film transistors has a semiconductor layer having a source portion, a channel portion, and a drain portion, wherein the inorganic insulating film is formed in a region that does not overlap at least the channel portions of the plurality of second thin-film transistors when seen from a direction normal to the first substrate, wherein the peripheral driving circuit is disposed within a region that is surrounded by the sealing member, wherein the liquid crystal display device further comprises a plurality of terminals formed outside the region surrounded by the sealing member, said plurality of terminals being electrically connected to the peripheral driving circuit, and wherein an edge of the inorganic insulating film extends through the sealing member to a region having the plurality of terminals.

* * * * *